(12) United States Patent
Shin et al.

(10) Patent No.: US 10,942,445 B2
(45) Date of Patent: Mar. 9, 2021

(54) BLANKMASK AND PHOTOMASK, AND METHODS OF FABRICATING THE SAME

(71) Applicant: S&S TECH Co., Ltd., Daegu-si (KR)

(72) Inventors: Cheol Shin, Daegu-si (KR); Jong-Hwa Lee, Daegu-si (KR); Chul-Kyu Yang, Daegu-si (KR); Min-Ki Choi, Daegu-si (KR)

(73) Assignee: S&S TECH Co., Ltd., Daegu-si (KR)

( * ) Notice: Subject to any disclaimer, the term of this patent is extended or adjusted under 35 U.S.C. 154(b) by 154 days.

(21) Appl. No.: 16/213,863

(22) Filed: Dec. 7, 2018

(65) Prior Publication Data

US 2020/0019053 A1    Jan. 16, 2020

(30) Foreign Application Priority Data

Jul. 13, 2018 (KR) .......................... 10-2018-0081353
Aug. 13, 2018 (KR) .......................... 10-2018-0094127

(51) Int. Cl.
*G03F 1/50* (2012.01)

(52) U.S. Cl.
CPC ...................................... *G03F 1/50* (2013.01)

(58) Field of Classification Search
CPC .................. G03F 1/50; G03F 1/80; G03F 1/54
See application file for complete search history.

(56) References Cited

U.S. PATENT DOCUMENTS

| | | | |
|---|---|---|---|
| 2009/0246645 A1 | 10/2009 | Nozawa | |
| 2013/0095415 A1 | 4/2013 | Nam et al. | |
| 2014/0004449 A1 * | 1/2014 | Nam | G03F 1/24 430/5 |
| 2016/0054650 A1 | 2/2016 | Nam et al. | |
| 2016/0077425 A1 | 3/2016 | Fukaya et al. | |
| 2016/0291453 A1 | 10/2016 | Inazuki et al. | |
| 2016/0377975 A1 | 12/2016 | Matsumoto et al. | |
| 2017/0023854 A1 * | 1/2017 | Nam | G03F 1/46 |
| 2017/0255095 A1 | 9/2017 | Kosaka et al. | |
| 2019/0204728 A1 | 7/2019 | Shishido | |

FOREIGN PATENT DOCUMENTS

| | | |
|---|---|---|
| CN | 103048874 A | 4/2013 |
| CN | 106019808 A | 10/2016 |
| JP | 2009244793 A | 10/2009 |
| JP | 2014010454 A | 1/2014 |
| JP | 2016057577 A | 4/2016 |
| TW | 201608328 A | 3/2016 |
| TW | 201802269 A | 1/2018 |
| WO | 2015141078 A1 | 9/2015 |
| WO | 2018037863 A1 | 3/2018 |

\* cited by examiner

*Primary Examiner* — Stewart A Fraser
(74) *Attorney, Agent, or Firm* — William Park & Associates Ltd.

(57) ABSTRACT

A blankmask according to the present disclosure includes a light-shielding film provided on a transparent substrate; and a hard mask film provided on the light-shielding film and comprising molybdenum chromium (MoCr). Thus, the hard mask film has not only an enhanced etching speed but also sufficient etching resistance to fluorine (F)-based dry etching, so that an etching load against a resist film can be decreased and a hard mask film pattern and a light-shielding film pattern can be improved in a line edge roughness (LER), thereby forming a photomask for high-precision pattern printing.

7 Claims, 1 Drawing Sheet

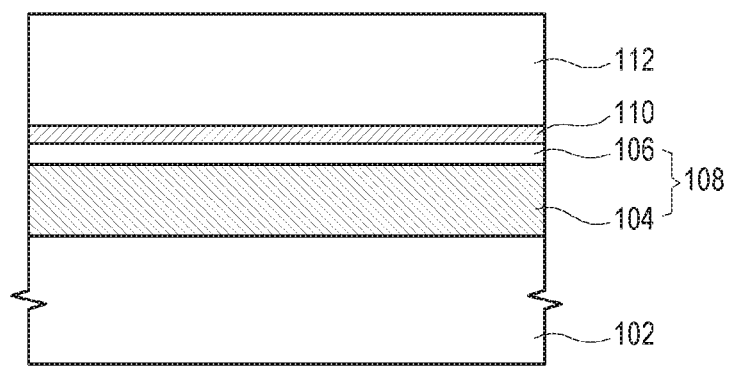

BLANKMASK AND PHOTOMASK, AND METHODS OF FABRICATING THE SAME

CROSS-REFERENCE TO RELATED THE APPLICATION

This application claims priorities from Korean Patent Application Nos. 10-2018-0081353 filed on Jul. 13, 2018 and 10-2018-0094127 filed on Aug. 13, 2018 in the Korean Intellectual Property Office, the disclosure of which is incorporated herein by reference.

BACKGROUND

Field

The present disclosure relates to a blankmask and a photomask and methods of fabricating the same, and more particularly to a blankmask and a photomask and methods of fabricating the same, in which a hard mask film is provided for fabricating a semiconductor device in a class of 32 nm or below, in particular 14 nm or below.

Description of the Related Art

Nowadays, a high-level semiconductor microfabrication technology has become very important to meet demands for miniaturization of a circuit pattern due to high integration of a large-scale integrated circuit. In a case of a highly integrated circuit, there have been increasing technical demands for circuit arrangement or the like due to the integration, a contact hall pattern for interlayered connection, and miniaturization of circuit wiring for high-speed operation and low power consumption. To satisfy these demands, a technology for recording a high-resolution pattern together with a precise circuit pattern has been required in fabricating a photomask in which an original circuit pattern is recorded.

As a part of efforts to achieve the high-resolution pattern, a blankmask with a hard mask film has recently been developed and applied. Unlike the conventional binary blankmask or phase-shift blankmask, this blankmask with the hard mask film includes the hard mask film at a lower side adjacent to a resist film and thus uses not the resist film but a hard mask film pattern as an etching mask for forming a lower light-shielding film pattern.

In the blankmask using the hard mask film, the hard mask film is so thin that the resist film can be thin, thereby ultimately achieving high resolution. Further, the hard mask film needs a relatively short etching time to form a pattern as compared with that for the light-shielding film pattern, so that a loading effect can be decreased while the pattern is formed, thereby ultimately improving critical dimension (CD) linearity.

Recently, not only the high resolution of the photomask but also precision in pattern printing has become important. Such precision in the pattern printing is affected by a line edge roughness (LER) at an edge of a pattern formed in the photomask and further has an effect on even optical proximity correction (OPC), and thus its importance has been gradually magnified.

This is equally applied to the blankmask having the hard mask film, in particular, increasingly important with development of a tech node, for example, development from a logic 14 nm tech toward a high tech for logic 10 nm, logic 7 nm or below.

Meanwhile, the LER of the final pattern depends on various conditions such as exposure condition, resist, thin film material, etching condition, etc. Among them, in particular, the material of the final pattern, and the LER of an upper etching mask for forming the final pattern have a great effect on the LER of the final pattern.

For a conventional binary blankmask having the hard mask film, a chrome (Cr)-group hard mask film material is applied to a molybdenum silicide (MoSi)-group light-shielding film. In this case, the chrome (Cr)-hard mask film material is etched by chlorine (Cl)-based etching gas, and has shortcomings that an etching speed is slow. Further, the chrome (Cr)-group hard mask film material has shortcomings that the etching speed gets slower as oxygen (o) content decreases to improve the pattern shape of the resist film. Such problems eventually make the LER of the chrome (Cr)-group hard mask pattern bad, and also cause the light-shielding film, which is formed using the hard mask film pattern as the etching mask, to have a bad LER. In particular, it doesn't matter at a low-end tech, but a problem that precision in a printing rate based on the LER of the pattern is lowered arises at a high-end tech, e.g. as a process is performed toward 7 nm, 5 nm, and so on.

SUMMARY

Accordingly, an aspect of the present disclosure is to make a binary blankmask with a hard mask have an improved line edge roughness (LER) of a hard mask film pattern, thereby ultimately providing a blankmask and a photomask, and methods of fabricating the same, in which a light shielding film pattern is excellent in the LER.

An aspect of the present disclosure is to provide a blankmask and a photomask, and methods of fabricating the same, in which a pattern is achieved in a class of 32 nm or below, in particular 14 nm or below.

According to one embodiment of the present disclosure, there may be provided a blankmask including a light-shielding film provided on the transparent substrate; and a hard mask film provided on the light-shielding film and containing chrome (Cr) and one or more kinds of metal.

The metal may contain one or more kinds of metal selected among molybdenum (Mo), titanium (Ti), zirconium (Zr), vanadium (V), manganese (Mn), iron (Fe), cobalt (Co), nickel (Ni), copper (Cu), zinc (Zn), gallium (Ga), germanium (Ge), niobium (Nb), ruthenium (Ru), rhodium (Rh), palladium (Pd), silver (Ag), cadmium (Cd), indium (In), tin (Sn), hafnium (Hf), tantalum (Ta), tungsten (W), osmium (Os), iridium (Ir), platinum (Pt), gold (Au), aluminum (Al), magnesium (Mg), lithium (Li), and selenium (Se).

The hard mask film may contain the metal and chrome (Cr) solely, or may contain one or more kinds of light elements among oxygen (O), carbon (C) and nitrogen (N) in addition to the metal and chrome (Cr).

The hard mask film may contain molybdenum chromium (MoCr) solely, or may contain one or more kinds of light elements among oxygen (O), carbon (C) and nitrogen (N) in addition to molybdenum chromium (MoCr).

The hard mask film may be formed using a molybdenum chromium (MoCr) target, and the target has a composition ratio of Mo:Cr=0.1 at %:99.9 at %~30 at %:70 at %.

The metal contained in the hard mask film may have a content of 0.1 at %~30 at %.

The hard mask film may contain the metal and chrome (Cr), a composition ratio (M/Cr) between which ranges from $1/1000$ to $1/5$.

The light-shielding film may contain at least one kind of material among oxygen (O), carbon (C) and nitrogen (N) in addition to molybdenum silicide (MoSi).

BRIEF DESCRIPTION OF THE DRAWINGS

The above and/or other aspects will become apparent and more readily appreciated from the following description of exemplary embodiments, taken in conjunction with the accompanying drawings, in which:

FIG. 1 is a cross-sectional view of a blankmask according to an embodiment of the present disclosure.

DETAILED DESCRIPTION OF EXEMPLARY EMBODIMENTS

Hereinafter, an embodiment of the present invention will be described in more detail with reference to the accompanying drawings. However, the embodiments are provided for illustrative purpose only and should not be construed to limit the scope of the invention. Therefore, it will be appreciated by a person having an ordinary skill in the art that various modifications and equivalents can be made from the embodiments. Further, the scope of the present invention has to be defined in the appended claims.

FIG. 1 is a cross-sectional view of a blankmask according to an embodiment of the present disclosure.

Referring to FIG. 1, a blankmask 100 according to the present disclosure includes a light-shielding film 108, a hard mask film 110, and a resist film 112 which are formed in sequence on a transparent substrate 102.

The transparent substrate 102 has a size of 6 inch×6 inch×0.25 inch (width×length×thickness), and a transmittance of 90% or higher with regard to exposure light having a wavelength of 200 nm or lower.

The light-shielding film 108 and the hard mask film 110 may be formed by various methods using physical or chemical deposition, for example, by anyone selected among chemical vapor deposition (CVD), direct current (DC) sputtering, DC magnetron sputtering, radio frequency (RF) sputtering, and ion-beam sputtering. Further, the sputtering method may use a single target or a plurality of simultaneously mounted targets to make a film grow.

The light-shielding film 108 may have a single layer structure or a multiple layer structure having two or more layers. In a case of a two-layer structure, the light-shielding film 108 may be divided into a light-shielding layer 104 and an anti-reflection layer 106.

The light-shielding film 108 may be made of a metal silicide compound, which contains silicon and one or more kinds of metal selected among titanium (Ti), vanadium (V), chrome (Cr), manganese (Mn), iron (Fe), cobalt (Co), nickel (Ni), copper (Cu), zinc (Zn), gallium (Ga), germanium (Ge), zirconium (Zr), niobium (Nb), molybdenum (Mo), ruthenium (Ru), rhodium (Rh), palladium (Pd), silver (Ag), cadmium (Cd), indium (In), tin (Sn), hafnium (Hf), tantalum (Ta), tungsten (W), osmium (Os), iridium (Ir), platinum (Pt), gold (Au), aluminum (Al), magnesium (Mg), lithium (Li), and selenium (Se), or may be made of the foregoing metal silicide compound added with at least one kind of material among oxygen (O), carbon (c), and nitrogen (N).

Preferably, the light-shielding film 108 may be made of a molybdenum silicide (MoSi) compound, and contain at least nitrogen (N). For example, the light-shielding layer 104 may be made of molybdenum silicide nitride (MoSiN), and the anti-reflection layer 106 may be made of molybdenum silicide nitride (MoSiN), molybdenum silicide oxide nitride (MoSiON), or etc.

The light-shielding film 108 may have a thickness of 30 nm to 70 nm, and preferably have a thickness of 35 nm to 60 nm. The light-shielding film 108 is a part where an ultimate pattern is formed, and is required to have a predetermined optical density. Therefore, it is difficult to satisfy the optical density when the thickness of the light-shielding film 108 is less than or equal to 30 nm, and there is a problem that a 3D effect (width×length×thickness; a pattern printing error caused by the thickness) occurs when the thickness of the light-shielding film 108 is greater than 70 nm.

The light-shielding film 108 has an optical density of 2.5~3.5 with regard to exposure light of 193 nm, and the uniformity of the optical density has a distribution within 0.1 on an area of 142 mm$^2$.

When stress is defined by TIR, the light-shielding film 108 has a TIR change rate of 200 nm or below, and preferably 100 nm or below as compared with the transparent substrate 102.

After film growth, the light-shielding film 108 may be additionally subjected to processes based on ion plating, ion beam, plasma surface treatment, rapid thermal process (RTP), a vacuum hot-plate baking device, and a furnace, under vacuum or at gas atmosphere using one or more selected from reaction oxidation gas and nitration gas.

The hard mask film 110 is used as the etching mask for the light-shielding film 108 to be arranged thereunder when a photomask is fabricated using the blankmask 100. To this end, the hard mask film 110 has a dry etching selectivity of 10 or higher, and preferably 30 or higher against the light-shielding film 108, and has a thickness of 2 nm~20 nm, and preferably 3 nm~10 nm.

The hard mask film 110 may be made of metal chromium (M), which contains chrome (Cr) and one or more kinds of metal selected among titanium (Ti), vanadium (V), manganese (Mn), iron (Fe), cobalt (Co), nickel (Ni), copper (Cu), zinc (Zn), gallium (Ga), germanium (Ge), zirconium (Zr), niobium (Nb), molybdenum (Mo), ruthenium (Ru), rhodium (Rh), palladium (Pd), silver (Ag), cadmium (Cd), indium (In), tin (Sn), hafnium (Hf), tantalum (Ta), tungsten (W), osmium (Os), iridium (Ir), platinum (Pt), gold (Au), aluminum (Al), magnesium (Mg), lithium (Li), and selenium (Se), or may be made of metal chromium added with at least one kind of material among oxygen (O), carbon (c), and nitrogen (N).

Preferably, the hard mask film 110 may be made of molybdenum chromium (CrMo) or a molybdenum chromium (CrMo) compound such as MoCrN, MoCrO, MoCrC, MoCrCN, MoCrCO, MoCrON, MoCrCON, etc.

When a composition ratio between molybdenum (Mo) and chrome (Cr) contained in the hard mask film 110 is represented by "Mo/Cr", the composition ration may preferably have a range of 1/1000~1/5.

Based on the composition ratio, molybdenum (Mo) contained in the hard mask film 110 may have a content of 0.1 at %~30 at %, and preferably 5 at %~20 at %. When the content of molybdenum (Mo) is lower than 0.1 at %, the content of molybdenum (Mo) is so low that an etching speed is hardly enhanced, thereby ultimately having poor improvement in the LER of the pattern. On the other hand, when the content of molybdenum (Mo) is higher than 30 at %, problems of having cleaning resistance and lowering an etching selectivity when the lower light-shielding film is etched.

The hard mask film 110 may be formed using a single target of molybdenum chromium (MoCr) or a plurality of targets containing molybdenum (Mo) and chrome (Cr). The single target may have a composition ratio of Mo:Cr=0.1 at %:99.9 at % to 30 at %:70 at %.

The hard mask film 110 may be designed to have a single layer structure, or a two-or-more-layer or continuous layer structure in which the content of molybdenum (Mo) is adjusted, or may alternatively have a two-or-more-layered or continuous layer structure in which one or more kinds of material among oxygen (O), carbon (C) and nitrogen (N) are varied in composition.

The hard mask film 110 may be selectively removed after the light-shielding film pattern is completely formed during the fabrication process of the photomask.

The resist film 112 is formed by applying spin coating to a chemically amplified resist (CAR), and has a thickness of 40 nm~150 nm.

EMBODIMENT

Embodiment: Fabrication of Blankmask and Photomask

This embodiment discloses fabrication of a binary blankmask and a photomask using a hard mask film made of a MoCr compound.

First, referring to FIG. 1, the transparent substrate 102 was prepared as controlled to have a size of 6 inch×6 inch×0.25 inch (width×length×thickness), a flatness (TIR) of 300 nm or below, and a double refraction of 2 nm/6.35 mm.

Then, the light-shielding layer 104 made of MoSiN was formed by mounting a MoSi [10 at %:90 at %] compound target to a DC magnetron sputtering device, injecting a process gas of Ar:$N_2$=7 sccm:3 sccm, and supplying a process power of 0.7 kW. Then, the anti-reflection layer 106 made of MOSiN was formed by injecting a process gas of Ar:$N_2$=7.0 sccm:6.5 sccm, and supplying a process power of 0.6 kW, thereby finally completing the fabrication of the light-shielding film 108. Here, as results of measuring the optical density and the reflectivity of the light-shielding film 108 with regard to the exposure light having a wavelength of 193 nm, the light-shielding film 108 showed an optical density of 2.95 and a reflectivity of 33.5%. Further, as a result of measuring the thickness using an XRR device, the light-shielding film 108 showed a thickness of 47.5 nm.

Then, the light-shielding film 108 was subjected to thermal treatment for 20 minutes at a temperature of 350° C. through a vacuum RTP.

Subsequently, the MoCr hard mask film 110 was grown to have a thickness of 4 nm by using the MoCr [5 at %:95 at %] target on the light-shielding film 108, injecting an Ar process gas of 8 sccm, and supplying a process power of 0.7 kW.

Then, the hard mask film 110 was spin-coated with a chemically amplified resist film 112 as thick as a thickness of 100 nm, thereby completely fabricating the binary blankmask 100.

The blankmask 100 formed as above was subjected to exposure and development to thereby form the resist film pattern, and the hard mask film was etched with chlorine (Cl)-based gas while using the resist film pattern as the etching mask to thereby form the hard mask film pattern. At this time, an end point detection (EPD) device measured that the etching speed of the hard mask film was 1.2 Å/sec, and an over etching of 100% was applied in completing the growth of the hard mask film pattern.

The resist film pattern was removed, and then the lower light-shielding film was etched with fluorine (F)-based gas while using the hard mask film pattern as the etching mask. At this time, it was measured that the light-shielding film had an etching speed of 15.3 Å/sec, and an over etching of 60% was applied in completing the growth of the light-shielding film pattern.

Then, the hard mask pattern was removed to thereby ultimately and completely fabricate the photomask.

Comparative Example: Fabrication of Blankmask and Photomask

In the comparative example unlike the foregoing embodiment, a chrome (Cr)-thin film was formed as the hard mask film material.

In the blankmask according to the comparative example, the light-shielding film made of MoSiN was formed like that of the foregoing embodiment, and a chrome (Cr)-hard mask film was grown to have a thickness of 4 nm by using a chrome (Cr) target, injecting Ar gas of 8 sccm as the process gas, and supplying the process power of 0.7 kW.

Then, the chemically amplified resist was spin-coated to have a thickness of 100 nm, thereby ultimately completing the blankmask.

The blankmask 100 formed as above was subjected to exposure and development to thereby form the resist film pattern, and the hard mask film was etched with chlorine (Cl)-based gas while using the resist film pattern as the etching mask to thereby form the hard mask film pattern. At this time, the EPD device measured that the etching speed of the hard mask film was 0.7 Å/sec.

Then, like the foregoing embodiment, the lower light-shielding film was etched using the hard mask film pattern, and then the hard mask film pattern was removed to thereby completely fabricate the photomask.

LER Measurement-I: Light-Shielding Film Pattern

The patterns formed according to the foregoing embodiment and comparative example were subjected to LER measurement. The LER measurement were performed with regard to 7×7 points on the hard mask film pattern and the light-shielding film pattern. However, it is difficult to actually measure the hard mask film pattern, and thus the light-shielding film was measured.

As results of the LER measurement, the LER of the light-shielding film pattern formed according to the embodiment was 2.1 nm, and the LER of the light-shielding film pattern formed according to the comparative example was 3.8 nm. Accordingly, the LER of the light-shielding film pattern using the MoCr hard mask film material according to the embodiment was improved by about 60% or more as compared with that of the comparative example.

LER Measurement-II: Hard Mask Film Pattern

Taking difficulty of the foregoing LER measurement-I in measuring the LER of the hard mask film pattern, the hard mask films according to the embodiment and comparative example were grown to have a thickness of 30 nm, and then subjected to a patterning process and LER measurement.

As results of the LER measurement, the LER of the hard mask film pattern formed according to the embodiment was 2.5 nm, and the LER of the hard mask film pattern formed according to the comparative example was 4.5 nm. Accordingly, the LER of the MoCr hard mask film according to the embodiment was improved by about 50% or more as compared with that of the comparative example.

Evaluation of Etching Speed According to Composition of Hard Mask Film

To evaluate the etching speed of the hard mask film according to the present disclosure, the hard mask films different in composition were grown and then tested.

TABLE 1

|  | Embodiment #1 | Embodiment #2 | Embodiment #3 | Comparative example |
|---|---|---|---|---|
| Target composition (Mo:Cr) | 5:95 | 10:90 | 20:80 | 0:100 (Only Cr) |
| Composition ratio | Mo:Cr 3 at %:97 at % | Mo:Cr 8 at %:92 at % | Mo:Cr 16 at %:84 at % | Cr 100 at % |
| Etching speed | 1.2 Å/sec | 1.35 Å/sec | 1.47 Å/sec | 0.7 Å/sec |

Referring to Table 1, content of molybdenum (Mo) was increased in the hard mask films according to the embodiments #1 to #3 by increasing content of molybdenum (Mo) contained in the MoCr target. In result, it is understood that the etching speed increases as content of molybdenum (Mo) increases.

On the other hand, the comparative example employed only chrome (Cr) in growing the hard mask film and showed an etching speed of 0.7 Å/sec, which is slower than those of the hard mask film made of molybdenum chromium (MoCr).

As described above, the hard mask film made of molybdenum chromium (MoCr) solely or a molybdenum chromium (MoCr) compound according to the present disclosure has not only an enhanced etching speed but also sufficient etching resistance to fluorine (F)-based dry etching, so that an etching load against the resist can be decreased and the hard mask film pattern and the light-shielding film pattern can be improved in the LER, thereby forming a photomask for high-precision pattern printing.

In the blankmask with the hard mask according to the present disclosure, molybdenum chromium (MoCr) solely or the molybdenum chromium (MoCr) compound are provided as the hard mask film material.

With this, the hard mask film pattern according to the present disclosure is improved in the LER to ultimately enhance the LER of the light-shielding film pattern, thereby securing high-precision pattern printing when the fabricated photomask is used in wafer printing.

Further, according to the present disclosure, a pattern can be formed in a class of 32 nm or below, in particular 14 nm or below.

Although the present disclosure has been shown and described with exemplary embodiments, the technical scope of the present disclosure is not limited to the scope disclosed in the foregoing embodiments. Therefore, it will be appreciated by a person having an ordinary skill in the art that various changes and modifications may be made from these exemplary embodiments. Further, it will be apparent as defined in the appended claims that such changes and modifications are involved in the technical scope of the present disclosure.

What is claimed is:

1. A blankmask comprising:
   a transparent substrate;
   a light-shielding film provided on the transparent substrate, the light-shielding film comprising molybdenum (Mo) and silicon (Si); and
   a hard mask film provided on the light-shielding film and comprising chrome (Cr) and one or more kinds of metal,
   wherein the metal contained in the hard mask film includes molybdenum (Mo) having a content of 0.1 at %~30 at %.

2. The blankmask according to claim 1, wherein the metal further comprises one or more kinds of metal selected among titanium (Ti), zirconium (Zr), vanadium (V), manganese (Mn), iron (Fe), cobalt (Co), nickel (Ni), copper (Cu), zinc (Zn), gallium (Ga), germanium (Ge), niobium (Nb), ruthenium (Ru), rhodium (Rh), palladium (Pd), silver (Ag), cadmium (Cd), indium (In), tin (Sn), hafnium (Hf), tantalum (Ta), tungsten (W), osmium (Os), iridium (Ir), platinum (Pt), gold (Au), aluminum (Al), magnesium (Mg), lithium (Li), and selenium (Se).

3. The blankmask according to claim 1, wherein the hard mask film comprises molybdenum chromium (MoCr), or comprises one or more kinds of light elements among oxygen (O), carbon (C) and nitrogen (N) in addition to molybdenum chromium (MoCr).

4. The blankmask according to claim 1, wherein the hard mask film has a thickness of 2 nm~20 nm.

5. The blankmask according to claim 1, wherein the hard mask film comprises a single layer structure, a continuous layer structure in which compositions or composition ratios vary, or a multi-layer structure of two or more layers between which compositions or composition ratios vary.

6. The blankmask according to claim 1, wherein the light-shielding film comprises at least one kind of material among oxygen (O), carbon (C) and nitrogen (N) in addition to molybdenum silicide (MoSi).

7. A photomask fabricated by the blankmask according to claim 1.

* * * * *